(12) United States Patent
Tong et al.

(10) Patent No.: US 8,513,954 B2
(45) Date of Patent: Aug. 20, 2013

(54) TEST CIRCUIT FOR RESISTOR CAPACITOR CIRCUITS

(75) Inventors: Song-Lin Tong, Guangdong (CN); Qi-Yan Luo, Guangdong (CN); Peng Chen, Guangdong (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 362 days.

(21) Appl. No.: 13/081,502

(22) Filed: Apr. 7, 2011

(65) Prior Publication Data
US 2012/0176142 A1    Jul. 12, 2012

(30) Foreign Application Priority Data

Jan. 12, 2011   (CN) .......................... 2011 1 0005507

(51) Int. Cl.
*H01H 31/02*    (2006.01)
(52) U.S. Cl.
USPC .......................................... 324/555; 324/537

(58) Field of Classification Search
None
See application file for complete search history.

(56) References Cited

U.S. PATENT DOCUMENTS 3,822,401 A * 7/1974 Parker ........................... 324/132
4,290,009 A * 9/1981 Sanpei et al. ................. 324/646

\* cited by examiner

*Primary Examiner* — Minh N Tang
(74) *Attorney, Agent, or Firm* — Altis Law Group, Inc.

(57) ABSTRACT

An RC test circuit includes an RC circuit, a digital rheostat, a control chip, and an oscillograph. The RC circuit includes a plurality of positive terminals and a plurality of negative terminals. The digital rheostat includes a plurality of rheostats each including a sliding terminal and a fixed terminal. The sliding terminals are correspondingly connected to the positive terminals while the fixed terminals are correspondingly connected to the negative terminals. The control chip is connected to the digital rheostat, and configured for controlling the digital rheostat to change the resistance of each rheostat. The oscillograph is connected to the RC circuit for displaying a waveform of the RC circuit.

13 Claims, 2 Drawing Sheets

TEST CIRCUIT FOR RESISTOR CAPACITOR CIRCUITS

BACKGROUND

1. Technical Field

The present disclosure relates to resistor-capacitor (RC) circuits, and particularly, to a test circuit capable of efficiently testing resistance of resistors of an RC circuit.

2. Description of Related Art

In an RC circuit, resistance of resistors of the RC circuit can greatly affect stability of the entire RC circuit. Therefore, in the design of the RC circuit, resistors of varying resistances are placed in the RC circuit in turn to test stability of the RC circuit at a desired performance. However, in this process, it is required to manually change out each resistor every time, which can be time consuming and inconvenient.

Therefore, it is desirable to provide RC test circuit which can overcome the problems described above.

DETAILED DESCRIPTION

Exemplary embodiments of the disclosure will now be described in detail, with reference to the accompanying drawing.

Figure 1:
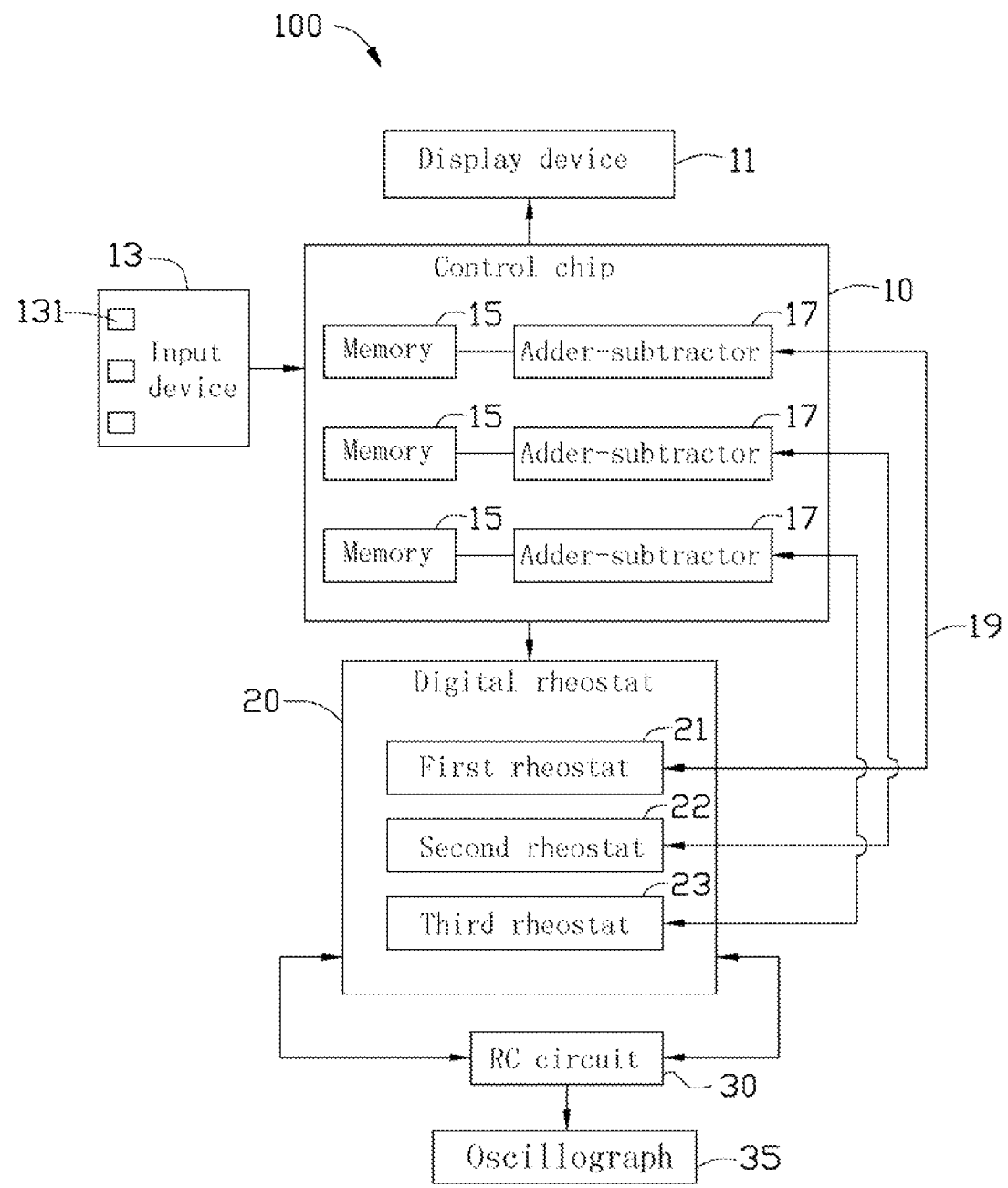
FIG. 1 is a functional block diagram of a RC test circuit, according to an exemplary embodiment.

FIG. 1 is a functional block diagram of a RC test circuit 100, according to an exemplary embodiment. The RC test circuit 100 includes a control chip 10, a digital rheostat 20, and a RC circuit 30. The control chip 10 is electronically connected to the digital rheostat 20, while the digital rheostat 20 is integrated in the RC circuit 30. The digital rheostat 20 is configured to replace a number of resistors (detailed below) of the RC circuit 30, to vary resistance of the RC circuit 30 according to operations by user or a preset program of the control chip 10.

The control chip 10 is a programmable processing unit, and includes a RA0 terminal, a RA1 terminal, a RA2 terminal, a RA3 terminal, a RB0 terminal, a RB1 terminal, a RB2 terminal, a RB3 terminal, a RC0 terminal, a RC1 terminal, a RC2 terminal, a RC3 terminal, a RC4 terminal, a RC5 terminal, a RC6 terminal, a first serial clock (SCL) terminal, and a first serial data (SDA) terminal.

The RA0-RA3 terminals are electrically connected to a display device 11, to continuously output a number of resistance value signals from the digital rheostat 20 to the display device 11, so that the display device 11 can display the resistance values of the digital rheostat 20. The RB0-RB3 terminals are connected to the digital rheostat 20 to output a number of control signals to the digital rheostat 20. The control signals signal the digital rheostat 20 to change resistance of the digital rheostat 20. The RC0-RC6 terminals are input/output (I/O) type terminals and connected to a peripheral input device 13, to input the control signals from the peripheral input device 13 and transfer the control signals to the RB0-RB3 terminals. In this embodiment, the peripheral input device 13 is a keyboard, the control signals are translated from a number of input resistance values implemented on the keyboard. In particular, the peripheral input device 13 includes three control sections 131 for respectively inputting the resistance values. The control area is defined to as an operation/inputting area that can trigger a function of the control chip 10, such as the number pad of the keyboard.

The control chip 10 includes at least one memory 15 and at least one adder-subtractor 17 in communication with the at least one memory 15. In this non-limiting embodiment, three memories 15 and three adder-subtractors 17 are introduced, to individually communicate with the three control sections 131 of the peripheral input device 13 and establish three signal channels 19. Each signal channel is configured to transfer signals through the corresponding control area, the memory, the adder-subtractor, and the digital rheostat 20. As such, the control signals from the peripheral input device 13 can be individually transferred to the digital rheostat 20 via the three signal channels 19, thereby reducing signal interference and making the signal processing easier. A current resistance value of the digital rheostat 20 is stored in each memory 15. The adder-subtractors 17 are configured for receiving the input resistance values from the peripheral input device 13, and calculating the sum or difference between the input resistance value and the corresponding current resistance value. For example, if the current resistance value has a maximum value of 10 kΩ, and if the input resistance value is 1 kΩ every time, then the adder-subtractor 17 will control the current resistance value 10 kΩ to minus 2 kΩ, then output an 8 kΩ to the display device 11. As mentioned above, the 1 kΩ value can be inputted by a keyboard. In other embodiments, the input resistance values can be chosen as 10Ω, 100Ω or other numbers.

The digital rheostat 20 includes a first rheostat 21, a second rheostat 22 and a third rheostat 23. The first rheostat 21, the second rheostat 22 and the third rheostat 23 are individually in communication with the three channels of the control chip 10, to respectively receive the control signals from the peripheral input device 13. In additional, the display device 11 can respectively display the resistance values of the first rheostat 21, the second rheostat 22, and the third rheostat 23 according to the control signals.

The first rheostat 21 includes a first sliding terminal VM0 and a first fixed terminal VL0. The second rheostat 22 includes a second sliding terminal VM1 and a second fixed terminal VL1. The third rheostat 23 includes a third sliding terminal VM2 and a third fixed terminal VL2. In the present embodiment, the first sliding terminal VM0 is adjacent to the fixed terminal VL0. The second sliding terminal VM1 is adjacent to the second fixed terminal VL1. The third sliding terminal VM2 is adjacent to the third fixed terminal VL2. The digital rheostat 20 is configured for changing the resistances of the first rheostat 21, the second rheostat 22 and the third rheostat 23 by respectively changing the resistances between the first sliding terminal VM0 and the first fixed terminal VL0, between the second sliding terminal VM1 and the second fixed terminal VL1, and between the third sliding terminal VM2 and the third fixed terminal VL2.

The digital rheostat 20 further includes an A0 terminal, an A1 terminal, an A2 terminal, an A3 terminal, a second SCL terminal, and a second SDA terminal. The A0-A3 terminals are correspondingly connected to the RB0~RB3 terminals, while the second SCL terminal and the second SDA terminal are correspondingly connected to the first SCL terminal and the first SDA terminal of the control chip 10. In this embodiment, the A0-A3 terminals are address terminals. The A0-A3 terminals can input the corresponding control signals from the control chip 10 to the first rheostat 21, the second rheostat 22, and the third rheostat 23, to change the resistances of the first rheostat 21, the second rheostat 22, and the third rheostat 23.

The RC circuit 30 includes a first RC sub-circuit 31, a second RC sub-circuit 33, and two output terminals V0 connected to the first RC sub-circuit 31 and the second RC sub-circuit 33. The two output terminals V0 are correspondingly connected to two test probes of an oscillograph 35.

Figure 2:
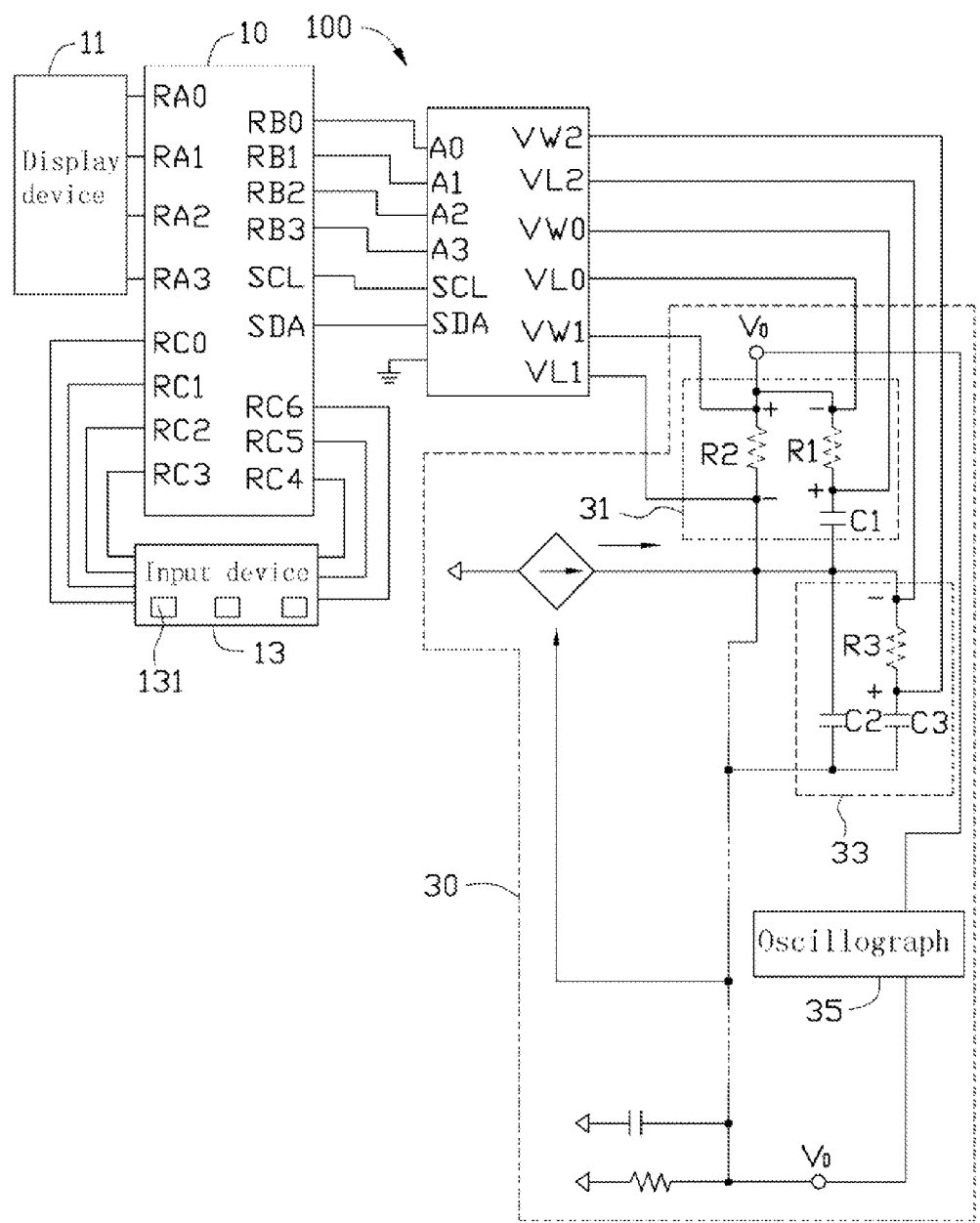
FIG. 2 is a circuit diagram of one embodiment of the RC test circuit of FIG. 1.

The first RC sub-circuit 31 includes a first position for positioning a first resistor R1 (shown in broken line in FIG. 2) therein, a second position for positioning a second resistor R2 therein, and a first capacitor C1. The first capacitor C1 is connected to the first resistor R1 in series and connected to the second resistor R2 in parallel. The second RC sub-circuit 33 includes a third position for positioning a third resistor R3 therein, a second capacitor C2, and a third capacitor C3. The third capacitor C3 is connected to the third resistor R3 in series and connected to the second capacitor C2 in parallel. Each of the first position, second position, and the third position can include a node used for soldering a corresponding resistor thereon, and includes a positive terminal (+) and a negative terminal (−). The positive terminals (+) of the positions are configured to correspondingly connect to the fixed terminals VL0-VL2. The negative terminals (−) of the positions are configured to correspondingly connect to the sliding terminals VW0-VW2. In particular, the positive terminal (+) of the first position is connected to the first sliding terminal VW0, the positive terminal (+) of the second position is connected to the second sliding terminal VW1, and the positive terminal (+) of the third position is connected to the third sliding terminal VW2. The negative terminal (−) of the first position is connected to the first fixed terminal VL0, the negative terminal (−) of the second position is connected to the second fixed terminal VL1, and the negative terminal (−) of the third position is connected to the third fixed terminal VL2. More specifically, in this embodiment, the positive terminals (+) and the negative terminals (−) are connected to the fixed terminal VL0 to VL2 and sliding terminals VW0 to VW2 via twisted pairs.

During the testing process of the RC circuit 30, according to the preset program or manual operations on the keyboard, the control chip 10 changes the resistances of the first rheostat 21, the second rheostat 22, and the third rheostat 23 according to the control signals. In this embodiment, the resistances of the first rheostat 21, the second rheostat 22, and the third rheostat 23 are increased from a minimum value. In other embodiments, the resistances of the first rheostat 21, the second rheostat 22, and the third rheostat 23 are decreased from the maximum value or increased/decreased from a middle value. As such, the resistance of the RC circuit 30 is changed with the changing of the resistances of the first rheostat 21, the second rheostat 22, and the third rheostat 23. Meanwhile, the oscillograph 35 displays a waveform of a series of output signals from the RC circuit 30, according to the changeable resistance of the RC circuit 30. When the waveform meets the requirements of the user, the resistances of the first rheostat 21, the second rheostat 22, and the third rheostat 23 are confirmed to be the best match, and the display device 30 displays only the resistances of the first rheostat 21, the second rheostat 22, and the third rheostat 23 at that time. After reading the resistances of the first rheostat 21, the second rheostat 22, and the third rheostat 23, the digital rheostat 20 is removed and the first resistor R1, the second resistor R2, and the third resistor R3 respectively corresponding to the first rheostat 21, the second rheostat 22, and the third rheostat 23 are placed to the first position, the second position, and the third position. As such, the RC circuit 30 can be completely designed.

It is understood that the control chip 10 can employ only one memory 15 and only one adder-subtractor 17, depending on the number of the rheostats of the digital rheostat 20.

It will be understood that particular exemplary embodiments and methods are shown and described by way of illustration only. The principles and the features of the present disclosure may be employed in various and numerous exemplary embodiments thereof without departing from the scope of the disclosure as claimed. The above-described exemplary embodiments illustrate the scope of the disclosure but do not restrict the scope of the disclosure.

What is claimed is:

1. An RC test circuit, comprising:
    an RC circuit comprising a plurality of positive terminals and a plurality of negative terminals;
    a digital rheostat comprising a plurality of rheostats each comprising a sliding terminal and a fixed terminal, the sliding terminals correspondingly connected to the positive terminals while the fixed terminals correspondingly connected to the negative terminals;
    a control chip connected to the digital rheostat, and configured for controlling the digital rheostat to change resistance of each rheostat; and
    an oscillograph connected to the RC circuit for displaying a waveform of the RC circuit.

2. The RC test circuit of claim 1, further comprising a display device for displaying the resistance of each rheostat of the digital rheostat.

3. The RC test circuit of claim 1, wherein the control chip comprises a RA0 terminal, a RA1 terminal, a RA2 terminal, a RA3 terminal, the RA0-RA3 terminals are connected to the display device, to continuously output a plurality of resistance value signals from the digital rheostat to the display device, so that the display device can display the resistance values of the digital rheostat.

4. The RC test circuit of claim 1, wherein the control chip comprises a RB0 terminal, a RB1 terminal, a RB2 terminal, and a RB3 terminal, the RB0-RB3 terminals are connected to the digital rheostat to output a plurality of control signals to the digital rheostat and control the digital rheostat to change resistances thereof.

5. The RC test circuit of claim 4, wherein the control chip comprises a RC0 terminal, a RC1 terminal, a RC2 terminal, a RC3 terminal, a RC4 terminal, a RC5 terminal, and a RC6 terminal, the RC0-RC6 terminals are connected to a peripheral input device to input the control signals and transfer the control signals to the RB0-RB3 terminals.

6. The RC test circuit of claim 5, wherein the digital rheostat comprises an A0 terminal, an A1 terminal, and an A2 terminal, the A0-A3 terminals are correspondingly connected to the RB0-RB3 terminals, and configured to input the corresponding control signals from the control chip to the first rheostat, the second rheostat, and the third rheostat.

7. The RC test circuit of claim 5, wherein the peripheral input device is a keyboard.

8. The RC test circuit of claim 5, wherein the control chip comprises at least one memory and at least one adder-subtractor in communication with the at least one memory, a current resistance value of the digital rheostat is stored in the at least one memory, the at least one adder-subtractor is configured for receiving the input resistance values from the peripheral input device, and calculating the sum or difference between the input resistance value and the corresponding current resistance value.

9. The RC test circuit of claim 8, wherein the digital rheostat comprises a first rheostat, a second rheostat, and a third rheostat, the first rheostat comprises a first sliding terminal and a first fixed terminal, the second rheostat comprises a second sliding terminal and a second fixed terminal, the third rheostat comprises a third sliding terminal and a third fixed terminal, the digital rheostat is configured for respectively changing the resistances of the first rheostat, the second rheostat and the third rheostat by respectively changing the resistances between the first sliding terminal and the first fixed terminal, between the second sliding terminal and the second fixed terminal, and between the third sliding terminal and the third fixed terminal.

10. The RC test circuit of claim 9, wherein the peripheral input device comprises three control sections to respectively input the resistance values, the control chip introduces three memories and three adder-subtractors individually communicating with the three control sections and establish three signal channels 19, the three signal channels 19 are respectively connected to the first rheostat, the second rheostat, and the third rheostat, to transfer the control signals to the first rheostat, the second rheostat, and the third rheostat.

11. The RC test circuit of claim 1, wherein the control chip comprises a first serial clock (SCL) terminal, and a first serial data (SDA) terminal, the digital rheostat comprises a second SCL terminal, and a second SDA terminal, the second SCL terminal and the second SDA terminal are correspondingly connected to the first SCL terminal and the first SDA terminal.

12. The RC test circuit of claim 1, wherein the RC circuit comprises a first RC sub-circuit, a second RC sub-circuit, and two output terminals connected to the first RC sub-circuit and the second RC sub-circuit, the two output terminals are correspondingly connected to two test probes of the oscillograph, the first RC sub-circuit comprises a first position for positioning a first resistor therein, a second position for positioning a second resistor therein, and a first capacitor, the first capacitor is connected to the first resistor in series and connected to the second resistor in parallel, the second RC sub-circuit comprises a third position for positioning a third resistor therein, a second capacitor, and a third capacitor, the third capacitor is connected to the third resistor in series and connected to the second capacitor in parallel.

13. The RC test circuit of claim 12, wherein each of the first, second, and third positions comprises the positive terminal and the negative terminal, the positive terminal of the first position is connected to the first sliding terminal, the positive terminal of the second position is connected to the second sliding terminal, and the positive terminal of the third position is connected to the third sliding terminal, the negative terminal of the first position is connected to the first fixed terminal, the negative terminal of the second position is connected to the second fixed terminal, and the negative terminal of the third position is connected to the third fixed terminal.

* * * * *